US009843302B2

(12) United States Patent
Analui et al.

(10) Patent No.: US 9,843,302 B2
(45) Date of Patent: Dec. 12, 2017

(54) REFLECTION AND HYBRID REFLECTION FILTERS

(71) Applicant: UNIVERSITY OF SOUTHERN CALIFORNIA, Los Angeles, CA (US)

(72) Inventors: Behnam Analui, Irvine, CA (US); Ankush Goel, San Jose, CA (US); Hossein Hashemi, Pacific Palisades, CA (US)

(73) Assignee: University of Southern California, Los Angeles, CA (US)

( * ) Notice: Subject to any disclaimer, the term of this patent is extended or adjusted under 35 U.S.C. 154(b) by 0 days.

(21) Appl. No.: 14/622,627

(22) Filed: Feb. 13, 2015

(65) Prior Publication Data

US 2015/0236395 A1    Aug. 20, 2015

Related U.S. Application Data

(60) Provisional application No. 61/940,064, filed on Feb. 14, 2014.

(51) Int. Cl.
*H01P 5/04* (2006.01)
*H03H 7/46* (2006.01)
(Continued)

(52) U.S. Cl.
CPC ................. *H03H 7/46* (2013.01); *H01P 1/20* (2013.01)

(58) Field of Classification Search
CPC .................................... H01P 5/18; H04B 1/52
(Continued)

(56) References Cited

U.S. PATENT DOCUMENTS 2,561,212 A    7/1951  Lewis
4,464,675 A    8/1984  Balaban et al.
(Continued)

FOREIGN PATENT DOCUMENTS

DE    102012107877 A1    2/2014
EP         1091497 A1    4/2001
(Continued)

OTHER PUBLICATIONS

USPTO 2016. Final Office Action, dated Mar. 31, 2016, for U.S. Appl. No. 14/626,572, entitled "Miniature Acoustic Resonator Based Filters and Duplexers with Cancellation Methodology," filed Feb. 19, 2015.

(Continued)

*Primary Examiner* — Dean Takaoka
(74) *Attorney, Agent, or Firm* — Brooks Kushman P.C.

(57) ABSTRACT

A two-port tunable or reconfigurable network having a filter transfer function may include: a network input port; a network output port; a hybrid coupler having a hybrid input port, a hybrid isolated port, a hybrid through port, and a hybrid coupled port; a first internal two-port network connected between the network input port and the hybrid input port; a second internal two-port network connected between the network output port and the hybrid isolated port; and a third internal two-port network connected between the hybrid through port and the hybrid coupled port. At least one of the first internal two-port network, the second internal two-port network, the third internal two-port network, and the hybrid coupler may be tunable or reconfigurable in response to an electrical signal or a user-operated control in a way that tunes or reconfigures the filter transfer function of the two-port tunable or reconfigurable network.
A two-port tunable or reconfigurable network having a filter transfer function may include: a network input port; a (Continued)

network output port; a hybrid coupler having a hybrid input port, a hybrid isolated port, a hybrid through port, and a hybrid coupled port; a first load; a second load; a first internal two-port network connected between the between the first load and the hybrid through port; and a second internal two-port network connected between the between the second load and the hybrid coupled port. At least one of the first internal two-port network, the second internal two-port network, the hybrid coupler, the first load, and the second load may be tunable or reconfigurable in response to an electrical signal or a user-operated control in a way that tunes or reconfigures the filter transfer function of the two-port tunable or reconfigurable network.

12 Claims, 7 Drawing Sheets

(51) Int. Cl.
H01P 5/12 (2006.01)
H03H 7/38 (2006.01)
H01P 1/20 (2006.01)

(58) Field of Classification Search
USPC ................................ 333/109–112, 116, 117
IPC ......................................................... H01P 5/18
See application file for complete search history.

(56) References Cited

U.S. PATENT DOCUMENTS

| | | |
|---|---|---|
| 4,694,266 A | 9/1987 | Wright |
| 4,963,945 A | 10/1990 | Cooper et al. |
| 4,968,967 A | 11/1990 | Stove |
| 5,483,248 A | 1/1996 | Milroy |
| 5,493,246 A | 2/1996 | Anderson |
| 5,691,978 A | 11/1997 | Kenworthy |
| 6,194,980 B1 | 2/2001 | Thon |
| 6,229,992 B1 | 5/2001 | McGeehan et al. |
| 6,496,061 B1 | 12/2002 | Bloom et al. |
| 6,721,544 B1 | 4/2004 | Franca-Neto |
| 6,819,302 B2 | 11/2004 | Volman |
| 7,072,614 B1 | 7/2006 | Kasperkovitz |
| 7,116,966 B2 | 10/2006 | Hattori et al. |
| 7,123,883 B2 | 10/2006 | Mages |
| 7,250,830 B2 | 7/2007 | Layne et al. |
| 7,283,793 B1 | 10/2007 | McKay |
| 7,330,500 B2 | 2/2008 | Kouki |
| 7,623,005 B2 | 11/2009 | Johansson et al. |
| 7,633,435 B2 | 12/2009 | Meharry et al. |
| 7,711,329 B2 | 5/2010 | Aparin et al. |
| 7,804,383 B2 | 9/2010 | Volatier et al. |
| 7,894,779 B2 | 2/2011 | Meiyappan et al. |
| 8,013,690 B2 | 9/2011 | Miyashiro |
| 8,135,348 B2 | 3/2012 | Aparin |
| 8,149,742 B1 | 4/2012 | Sorsby |
| 8,199,681 B2 | 6/2012 | Zinser et al. |
| 8,385,871 B2 | 2/2013 | Wyville |
| 8,422,412 B2 | 4/2013 | Hahn |
| 8,514,035 B2 | 8/2013 | Mikhemar et al. |
| 8,600,329 B1 | 12/2013 | Comeau et al. |
| 8,749,321 B2 | 6/2014 | Kim et al. |
| 9,543,630 B2 * | 1/2017 | Tokumitsu ............... H01P 5/12 |
| 2002/0089396 A1 | 7/2002 | Noguchi et al. |
| 2003/0109077 A1 | 6/2003 | Kim et al. |
| 2004/0000425 A1 | 1/2004 | White et al. |
| 2004/0127178 A1 | 7/2004 | Kuffner |
| 2004/0180633 A1 | 9/2004 | Nakatani et al. |
| 2005/0070232 A1 | 3/2005 | Mages |
| 2005/0289632 A1 | 12/2005 | Brooks |
| 2007/0105509 A1 | 5/2007 | Muhammad et al. |
| 2008/0128901 A1 | 6/2008 | Zurcher et al. |
| 2008/0227409 A1 | 9/2008 | Chang et al. |
| 2008/0261519 A1 | 10/2008 | DeMarco et al. |
| 2009/0054008 A1 | 2/2009 | Satou |
| 2009/0121797 A1 | 5/2009 | Karabatsos |
| 2009/0125253 A1 | 5/2009 | Blair et al. |
| 2009/0252252 A1 | 10/2009 | Kim et al. |
| 2009/0289744 A1 | 11/2009 | Miyashiro |
| 2010/0002620 A1 | 1/2010 | Proctor, Jr. et al. |
| 2010/0084146 A1 | 4/2010 | Roberts |
| 2010/0127795 A1 | 5/2010 | Bauer et al. |
| 2010/0134700 A1 | 6/2010 | Robert et al. |
| 2010/0148886 A1 | 6/2010 | Inoue et al. |
| 2010/0177917 A1 | 7/2010 | Van Der Werf |
| 2010/0323654 A1 | 12/2010 | Judson et al. |
| 2011/0069644 A1 | 3/2011 | Kim et al. |
| 2011/0080229 A1 | 4/2011 | Kenington |
| 2011/0080856 A1 | 4/2011 | Kenington |
| 2011/0134810 A1 | 6/2011 | Yamamoto et al. |
| 2011/0140803 A1 | 6/2011 | Kim et al. |
| 2011/0227664 A1 | 9/2011 | Wyville |
| 2012/0007605 A1* | 1/2012 | Benedikt ............... G01R 27/32 |
| | | 324/612 |
| 2012/0063496 A1 | 3/2012 | Giannini et al. |
| 2012/0140860 A1 | 6/2012 | Rimini et al. |
| 2012/0154071 A1 | 6/2012 | Bradley et al. |
| 2012/0163245 A1 | 6/2012 | Tone et al. |
| 2012/0161784 A1 | 8/2012 | Zhang et al. |
| 2012/0194269 A1 | 8/2012 | Schlager et al. |
| 2012/0201153 A1 | 8/2012 | Bharadia et al. |
| 2012/0201173 A1 | 8/2012 | Jain et al. |
| 2012/0212304 A1 | 8/2012 | Zhang et al. |
| 2012/0230227 A1 | 9/2012 | Weiss |
| 2013/0016634 A1 | 1/2013 | Smiley |
| 2013/0063299 A1 | 3/2013 | Proudkii |
| 2013/0083703 A1 | 4/2013 | Granger-Jones et al. |
| 2013/0109330 A1 | 5/2013 | Sahota et al. |
| 2013/0113576 A1 | 5/2013 | Inoue et al. |
| 2013/0130619 A1 | 5/2013 | Harverson et al. |
| 2013/0154887 A1 | 6/2013 | Hein et al. |
| 2013/0201880 A1 | 8/2013 | Bauder et al. |
| 2013/0201881 A1 | 8/2013 | Bauder et al. |
| 2013/0201882 A1 | 8/2013 | Bauder et al. |
| 2013/0241655 A1 | 9/2013 | Liss et al. |
| 2013/0241669 A1 | 9/2013 | Mikhemar et al. |
| 2013/0242809 A1 | 9/2013 | Tone et al. |
| 2013/0321097 A1 | 12/2013 | Khlat et al. |
| 2014/0140860 A1 | 5/2014 | Tibott et al. |
| 2014/0169236 A1 | 6/2014 | Choi et al. |
| 2014/0194073 A1 | 7/2014 | Wyville et al. |
| 2014/0204808 A1 | 7/2014 | Choi et al. |
| 2014/0376419 A1 | 12/2014 | Goel et al. |
| 2015/0118978 A1 | 4/2015 | Khlat |
| 2015/0163044 A1 | 6/2015 | Analui et al. |
| 2015/0236390 A1 | 8/2015 | Analui et al. |
| 2015/0236842 A1 | 8/2015 | Goel et al. |
| 2017/0030339 A1 | 2/2017 | Proudfoot |

FOREIGN PATENT DOCUMENTS

| | | |
|---|---|---|
| EP | 2733855 A1 | 5/2014 |
| EP | 2814172 | 12/2014 |
| EP | 2960981 A1 | 12/2015 |
| KR | 10-2010-0134324 | 12/2011 |
| WO | WO95/15018 A1 | 6/1995 |
| WO | WO2014032883 A1 | 3/2014 |
| WO | WO2014133625 A2 | 9/2014 |
| WO | WO2015089092 A1 | 6/2015 |

OTHER PUBLICATIONS

Hunter, I.C. et al. 2005. Passive Microwave Receive Filter Networks Using Low-Q Resonators. IEEE Microwave Magazine, Sep. 2005, pp. 46-53.

Phudpong, P. et al. 2007. Nonlinear Matched Reflection Mode Bandstop Filters for Frequency Selective Limiting Applications. In Microwave Symposium Conference, 2007, IEEE/MTT-S International, 2007, pp. 1043-1046.

(56) References Cited

OTHER PUBLICATIONS

Kannangara, S. et al. 2007. Analysis of an Adaptive Wideband Duplexer With Double-Loop Cancellation. IEEE Transactions on Vehicular Technology, vol. 56, No. 4, pp. 1761-1982, Jul. 2007.
Laforge, P.D. et al. 2009. Diplexer design implementing highly miniaturized multilayer superconducting hybrids and filters. IEEE Transactions on Applied Superconductivity, Apr. 2009, pp. 47-54.
Marcatili, E.A. et al. 1961. Band-Splitting Filter. Bell System Technical Journal, Jan. 1961, pp. 197-212.
Matthaei, G. et al. 1980. Microwave Filters, Impedance-Matching Networks, and Coupling Structures, Chapter 14: Directional, Channel-Separation Filters and Traveling-Wave Ring-Resonators, pp. 843-888; Chapter 16: Multiplexer Design, pp. 965-1000. Copyright 1980 Artech House, Inc., Dedham, MA; reprint of edition published by McGraw-Hill Book Company, Inc., 1964.
Korean International Searching Authority (ISA/KR). 2014. International Search Report and Written Opinion of the International Searching Authority, mailed Sep. 23, 2014, for PCT Application PCT/US2013/074155, entitled "Passive Leakage Cancellation Networks for Duplexers and Coexisting Wireless Communication Systems," published as WO 2014/133625A1.
United States International Searching Authority (ISA/US). 2015. International Search Report and Written Opinion of the International Searching Authority, mailed Mar. 3, 2015, for PCT Application PCT/US069372, entitled "Enhancing Isolation and Impedance Matching in Hybrid-Based Cancellation Networks and Duplexers," filed Dec. 9, 2014.
United States International Searching Authority (ISA/US). 2015. International Search Report and Written Opinion of the International Searching Authority, mailed May 20, 2015, for PCT Application PCT/US2015/016145, entitled "Hybrid-Based Cancellation in Presence of Antenna Mismatch," filed Feb. 17, 2015.
United States International Searching Authority (ISA/US). 2015. International Search Report and Written Opinion of the International Searching Authority, mailed May 27, 2015, for PCT Application PCT/US2015/015930, entitled "Reflection and Hybrid Reflection Filters," filed Feb. 13, 2015.
United States Patent and Trademark Office. 2015. Non-final Office Action, dated Jun. 15, 2015, for U.S. Appl. No. 14/102,244, filed Dec. 10, 2013, entitled "Passive Leakage Cancellation Networks for Duplexers and Coexisting Wireless Communication Systems," published Dec. 25, 2015 as US2014/0376419.
United States International Searching Authority (ISA/US). 2015. International Search Report and Written Opinion of the International Searching Authority, mailed Jun. 25, 2015, for PCT Application PCT/US2015/016642, entitled "Miniature Acoustic Resonator-Based Filters and Duplexers with Cancellation Methodology," filed Feb. 19, 2015.
USPTO. 2015. Office Action, dated Jul. 29, 2015 for U.S. Appl. No. 14/626,572, entitled "Miniature Acoustic Resonator Based Filters and Duplexers with Cancellation Methodology," filed Feb. 19, 2015.
USPTO. 2015. Final Office Action for U.S. Appl. No. 14/102,244, dated Sep. 22, 2015, entitled "Passive Leakage Cancellation Networks for Duplexers and Coexisting Wireless Communication Systems," Goel et al., inventors, published Dec. 25, 2014 as US 2014/0376419 A1.
USPTO 2016. Non-final Office Action, dated Jul. 15, 2016, for U.S. Appl. No. 14/626,572, entitled "Miniature Acoustic Resonator-Based Filters and Duplexers with Cancellation Methodology,".
USPTO. 2016. Notice of Allowance, dated Jul. 20, 2016, for U.S Appl. No. 14/102,244, entitled "Passive Leakage Cancellation Networks for Duplexers and Coexisting Wireless Communication Systems,".
European Patent Office, 2016, Extended EP Search Report dated Jul. 14, 2016, for EPC Appn. 13876497.2, 5 pgs.
Final Office Action dated Feb. 16, 2017 for U.S. Appl. No. 14/626,572, filed Feb. 19, 2015, 13 pgs.
Final Office Action dated Mar. 3, 2017 for U.S. Appl. No. 14/624,289, filed Feb. 17, 2015, 18 pgs.
Non-final Office action dated Nov. 4, 2016, U.S. Appl. No. 14/624,289, filed Aug. 20, 2015, 56 pgs.
Notice of Allowance dated Nov. 4, 2016, U.S. Appl. No. 14/565,752, filed Dec. 10, 2014, 66 pgs.
Non-final Office Action dated Aug. 10, 2010 for U.S. Appl. No. 14/624,289, filed Feb. 17, 2015, 32 pgs.
Notice of Allowance dated Oct. 18, 2017, U.S. Appl. No. 14/626,572, filed Feb. 19, 2015, 15 pgs.

* cited by examiner

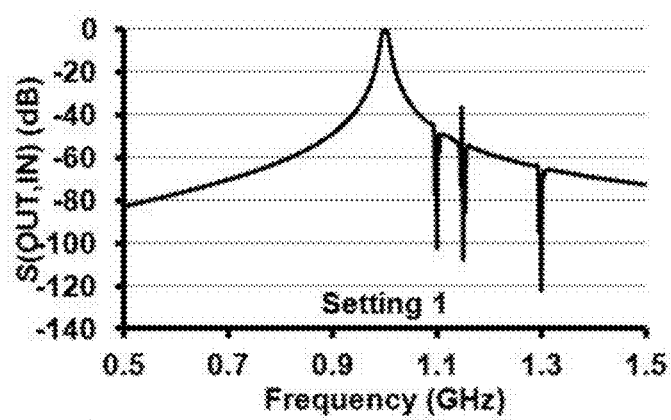
FIG. 11
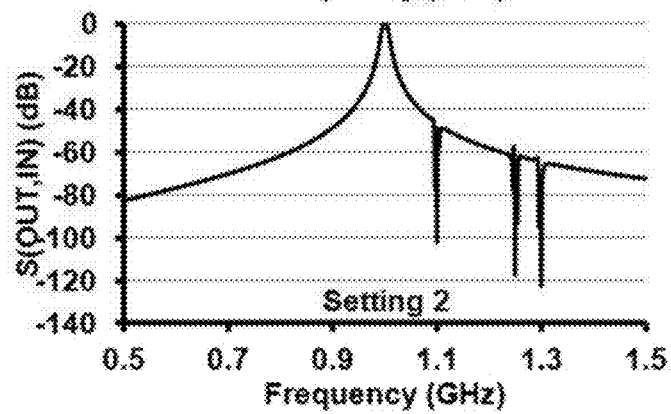
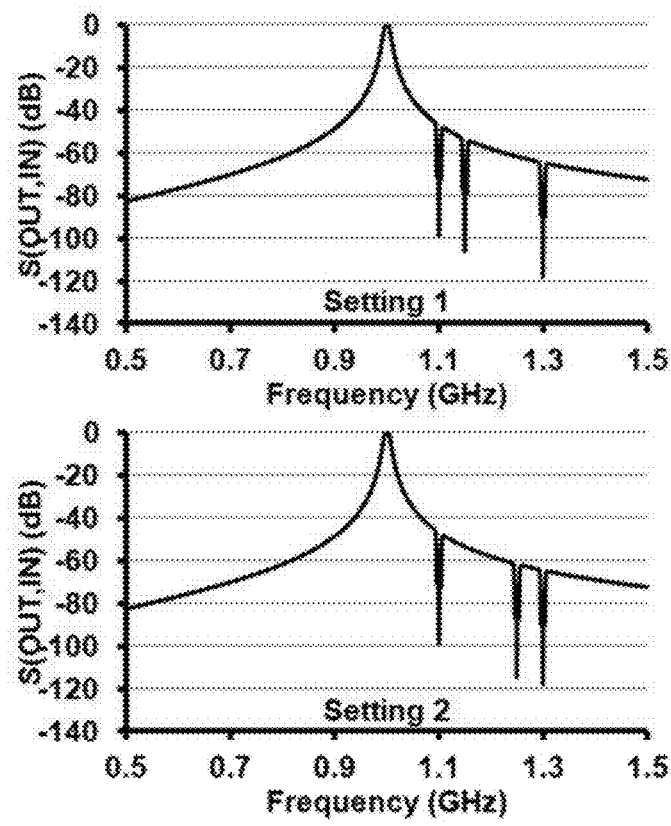
FIG. 12
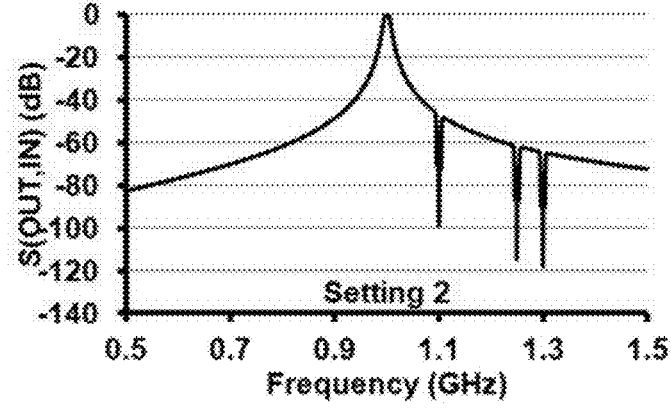

REFLECTION AND HYBRID REFLECTION FILTERS

CROSS-REFERENCE TO RELATED APPLICATION

This application is based upon and claims priority to U.S. provisional patent application 61/940,064, entitled "Reflection-Type and Hybrid-Reflection Type Filters," filed Feb. 14, 2014. The entire content of this application is incorporated herein by reference.

STATEMENT REGARDING FEDERALLY SPONSORED RESEARCH

This invention was made with Government support under Contract No. N00014-12-C-0130, awarded by the Office of Naval Research (ONR) and under Contract No. HR0011-12-C-0094, awarded by the Defense Advanced Research Projects Agency (DARPA). The Government has certain rights in the invention.

BACKGROUND

Technical Field

This disclosure relates to tunable and reconfigurable radio frequency (RF) filters suitable for multi-band, multi-standard, programmable, reconfigurable, adaptive, or cognitive communication systems.

Description of Related Art

Filters are essential parts of many electrical systems, such as those used in communication applications. In communication systems, filters may be used to select a desired information signal that is separated in frequency domain from other signals. Historically, filters have been classified depending on their transfer function into low pass filters (LPF), high pass filters (HPF), band pass filters (BPF), and band stop filters (BSF).

Radio frequency (RF) BPFs and BSFs are commonly used in wireless communication systems, such as band select, channel select, band reject, or channel reject filters. Wireless communication systems exploit frequency division multiple access (FDMA) where different users of the shared propagation medium, that is air, are assigned different frequency bands. For instance, FM broadcast stations are assigned different channels, each 200 KHz wide, across the 87.5 MHz to 108.0 MHz contiguous frequency band. A wireless receiver may need to select the desired channel among all other channels. Difficulty in realization of tunable RF filters has led to utilization of frequency conversion schemes, such as heterodyne, homodyne, image-reject, etc., where the desired channel is shifted in the frequency domain to fall within the passband of fixed channel select filters. Band selection is typically achieved using fixed RF BPFs.

In some communication systems, multiple disjoint frequency bands may be assigned for the same application. For instance, in cellular wireless standards, the information signal may reside within several disjoint frequency bands. In such systems, a single-band RF BPF may not be used as the band select filter. A common solution is utilization of an array of switchable RF BPFs with frequency responses. This approach can lead to large footprint, high cost, and large insertion loss due to utilization of switches.

In some communication systems, it is desirable to support multiple standards within the same platform. For instance, multi-standard cellular phones or multi-standard televisions or setup boxes can be highly desirable. The difference in frequency bands, channel assignments, and other features of these communication standards may prohibit utilization of filters with fixed characteristics.

In some communication systems, it is desirable to concurrently operate across multiple disjoint frequency bands. For instance, some wireless communication standards may use multiple frequency channels or bands to increase the data rate (more aggregate bandwidth) or robustness (diversity). Examples include carrier aggregation scenarios. Conventional filters with single bass-band or stop-band may not be sufficient for these applications. For instance, band-pass filters with multiple passbands may be desirable.

In some platforms, multiple communication systems operate concurrently and in close physical proximity of each other. For instance, smart phones, notebooks, personal digital assistants, tablets, laptops, personal computers, etc. may include several wireless communication devices such as those concurrently supporting WiFi, Bluetooth, GPS, cellular, TV, and radio. In these platforms, each communication device can emit signals that are undesirable for at least one of the other communication devices. In such coexistence scenarios, the filtering requirement may be more stringent. For instance, a combination of BPF and BSF may be useful.

In some communication systems, the electromagnetic environment changes leading into varying levels of desired and undesired signals. For instance, in a wireless environment, the frequency location and power levels of jammers or blockers presented at the input of a receiver may change. In these scenarios, the requirement for the presence of filters and associated specifications may change. For instance, in the presence of a large undesired signal, a BSP may be used while in its absence the BSP may be bypassed to reduce its insertion loss at the desired frequency band.

The designation of the frequency band or channel for a wireless receiver may be dynamic. For instance, a wireless communication system may use a portion of the frequency spectrum that is available at a given location and at a given time. These systems may include schemes that qualify them as cognitive radios. Examples include systems that are meant to operate in white spaces. In such communication systems, the specification of filters may need to dynamically accommodate the instantaneous needs.

The demand for increased capacity and number of users in a wireless communication system has led to closer channel spacing and reduction in so-called guard bands. This trend dictates more selective filters. RF filters with higher orders may be used in such systems. Given a technology, passive filters with higher order will incur higher insertion loss.

There may be a large interest and need in realization of RF filters with tunable or reconfigurable frequency responses. Such RF filers can enable low-cost, power-efficient, compact wireless communication devices, systems, and platforms including those that support multiple frequency bands, multiple standards, or multiple concurrent radios. Despite ongoing research and development towards realization of tunable or reconfigurable RF filters, embodiments that satisfy the stringent requirements of communication systems may not exist. This is evidenced by the continued use of switched filter approaches in commercial communication systems.

Reflection-type filters can use an elegant method to produce desired (maybe even unconventional) filter responses using traditional filters and hybrid couplers (U.S. Pat. No. 4,694,266, U.S. Pat. No. 4,963,945, U.S. Pat. No. 5,525,945, U.S. Pat. No. 5,781,084, U.S. Pat. No. 8,013,690, U.S. Pat. No. 8,749,321). For example, high quality BSFs can be implemented using high quality low loss BPF with high quality factor Surface Acoustic Wave (SAW) resonators and low loss quadrature hybrid.

Though these prior works have shown the efficacy of the reflection-type filters, they may have been limited to meet only a pre-determined (and static) frequency response or a set of pre-determined frequency responses. As discussed earlier, static or set of static filter responses may not be sufficient to meet the requirement of many communication systems. A frequency tunable notch filter based on reflection-type filter concept exists (U.S. Pat. No. 8,013,690) but it is limited to only narrowband notch frequency response.

It may be highly desirable to have a filter response which can not only be tunable but also reconfigurable. For example, the ability to dynamically change the number of noncontiguous passbands or stopbands along with the frequency at which these are present can be very advantageous. For example, a wireless communication receiver can add stopbands (or notches) to a filter response upon detection of undesired interference or jamming signals. For instance, a multi-standard wireless communication system may change a filter response from band-pass to band-stop for different standards. For instance, a wireless communication system may increase the number of passbands in a filter response to support concurrent multi-band operation or carrier aggregation while reducing the levels of undesired signals that are located outside of the frequency bands of interest. In many scenarios, the RF filter's response should be dynamically changeable (on the fly tunability or reconfigurability).

SUMMARY

A two-port tunable or reconfigurable network having a filter transfer function may include: a network input port; a network output port; a hybrid coupler having a hybrid input port, a hybrid isolated port, a hybrid through port, and a hybrid coupled port; and an internal two-port network connected between the hybrid through port and the hybrid coupled port. At least one of the internal two-port network and the hybrid coupler may be tunable or reconfigurable in response to an electrical signal or a user-operated control in a way that tunes or reconfigures the filter transfer function of the two-port tunable or reconfigurable network.

The filter transfer function may have multiple passbands or stopbands.

At least one of the internal two-port network and the hybrid coupler may be an integrated circuit, on the same substrate, and/or integrated with a receiver, a transmitter, or a transceiver.

An additional two-port network may be connected between the network input port and the hybrid input port.

An additional two-port network may be connected between the network output port and the hybrid isolated port.

A two-port tunable or reconfigurable network may include multiple instances of a two-port tunable or reconfigurable network connected in series.

A two-port tunable or reconfigurable network having a filter transfer function may include: a network input port; a network output port; a hybrid coupler having a hybrid input port, a hybrid isolated port, a hybrid through port, and a hybrid coupled port; a first load; a second load; a first internal two-port network connected between the between the first load and the hybrid through port; and a second internal two-port network connected between the between the second load and the hybrid coupled port. At least one of the first internal two-port network, the second internal two-port network, the hybrid coupler, the first load, and the second load may be tunable or reconfigurable in response to an electrical signal or a user-operated control in a way that tunes or reconfigures the filter transfer function of the two-port tunable or reconfigurable network.

At least one of the first internal two-port network, the internal second two-port network, the hybrid coupler, the first load, and the second load may be an integrated circuit, on the same substrate, and/or integrated with a receiver, a transmitter, or a transceiver.

An additional two-port network may be connected between the network input port and the hybrid input port.

An additional two-port network connected may be between the network output port and the hybrid isolated port.

Multiple instances of the two-port tunable or reconfigurable network may be connected in series.

These, as well as other components, steps, features, objects, benefits, and advantages, will now become clear from a review of the following detailed description of illustrative embodiments, the accompanying drawings, and the claims.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

Represented simulation results of various embodiments are only for illustrative reasons, and are not meant to cover all possible responses that various embodiments enable. For instance, the presented simulation results cover filters with a single passband and at least one stopband (or notch) in their transfer functions. Filters with multiple passbands or stopbands may also be realized using the embodiments or other teachings of this patent. Filters whose transfer functions fundamentally change as a function of at least one stimulus may also be realized using the embodiments or other teachings of the patent.

Tunable/reconfigurable response may be realized when at least one of the components F1, F2, F3, or H1 is tunable/reconfigurable.

Figure 5:
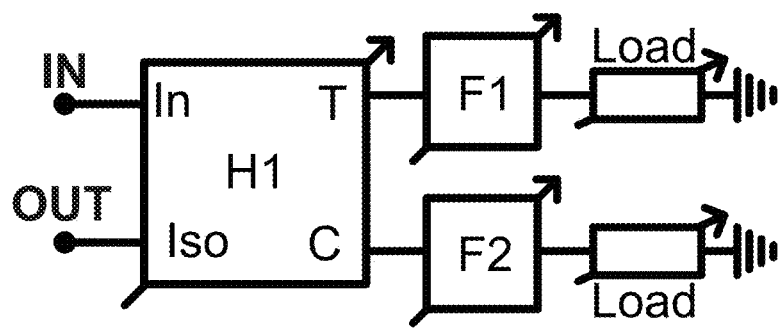

FIG. 5 illustrates an embodiment of a tunable/reconfigurable reflection-type filter realized by terminating the through (T) and coupled (C) ports of a tunable/reconfigurable hybrid coupler H1 with two tunable/reconfigurable filters F1 and F2 and their associated tunable/reconfigurable loads. Tunable/reconfigurable response may be realized when at least one of the components H1, F1, F2, or their associated loads is tunable/reconfigurable.

Figure 6:
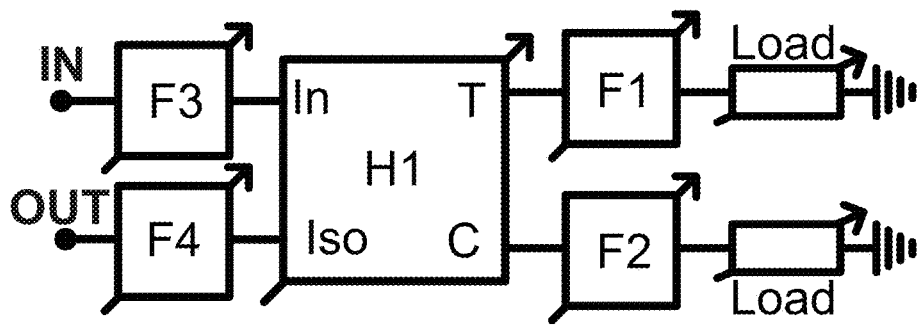

FIG. 6 illustrates an embodiment of a tunable/reconfigurable reflection-type filter realized by terminating the through (T) and coupled (C) ports of a tunable/reconfigurable hybrid coupler H1 with two tunable/reconfigurable filters F1 and F2 and their associated tunable/reconfigurable loads, and placing two other tunable/reconfigurable filters in series with the input (In) and isolated (Iso) ports of the tunable/reconfigurable hybrid coupler and the tunable/reconfigurable two-port reflection-type filter ports. Tunable/reconfigurable response may be realized when at least one of the components H1, F3, F4, F1, F2, or their associated loads is tunable/reconfigurable.

Figure 4:
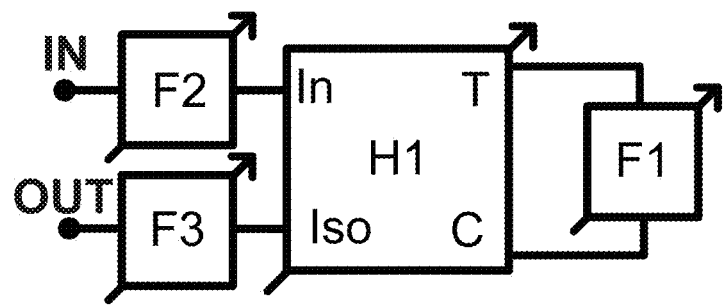
FIG. 4 illustrates an embodiment a tunable/reconfigurable two-port reflection-type filter realized by placing tunable/reconfigurable filter F1 between through (T) and coupled (C) ports of a tunable/reconfigurable hybrid coupler H1, and two other tunable/reconfigurable filters F2 and F3 connected in series with the input (In) and isolated (Iso) ports of the hybrid coupler and the two-port reflection-type filter ports.
Figure 7:
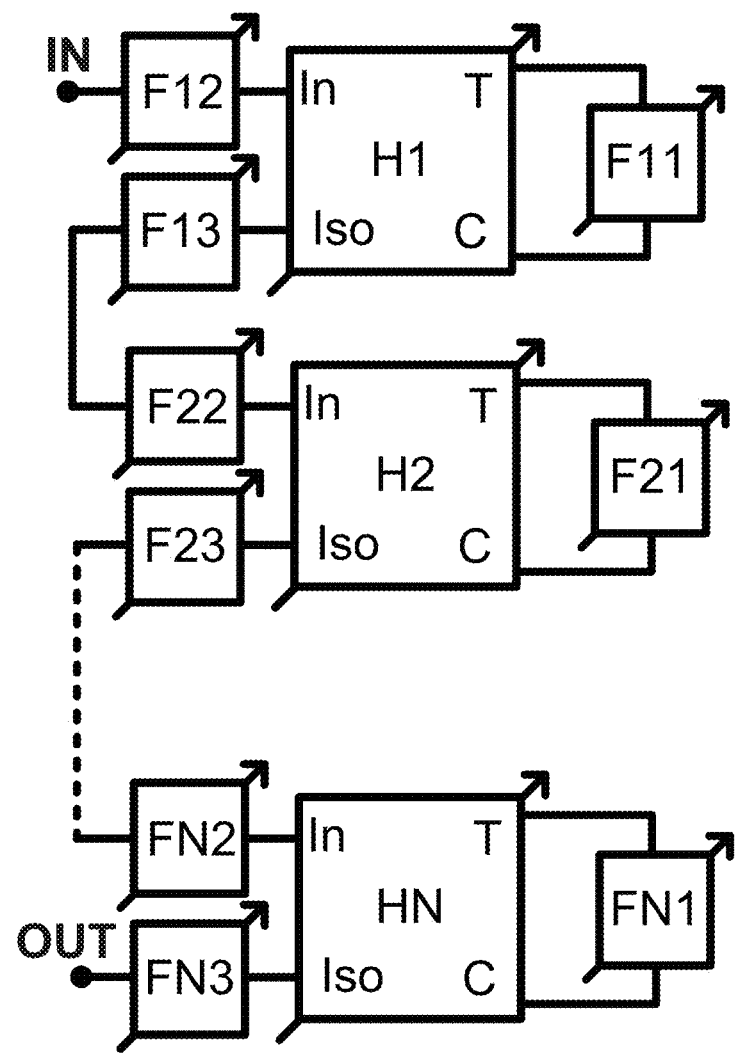

FIG. 7 illustrates an embodiment of a two-port filter realized as a nested connection of multiple reflection-type filters that are realized using the approach shown in FIG. 4. Fixed as well as tunable/reconfigurable versions of this approach may be used.

Figure 8:
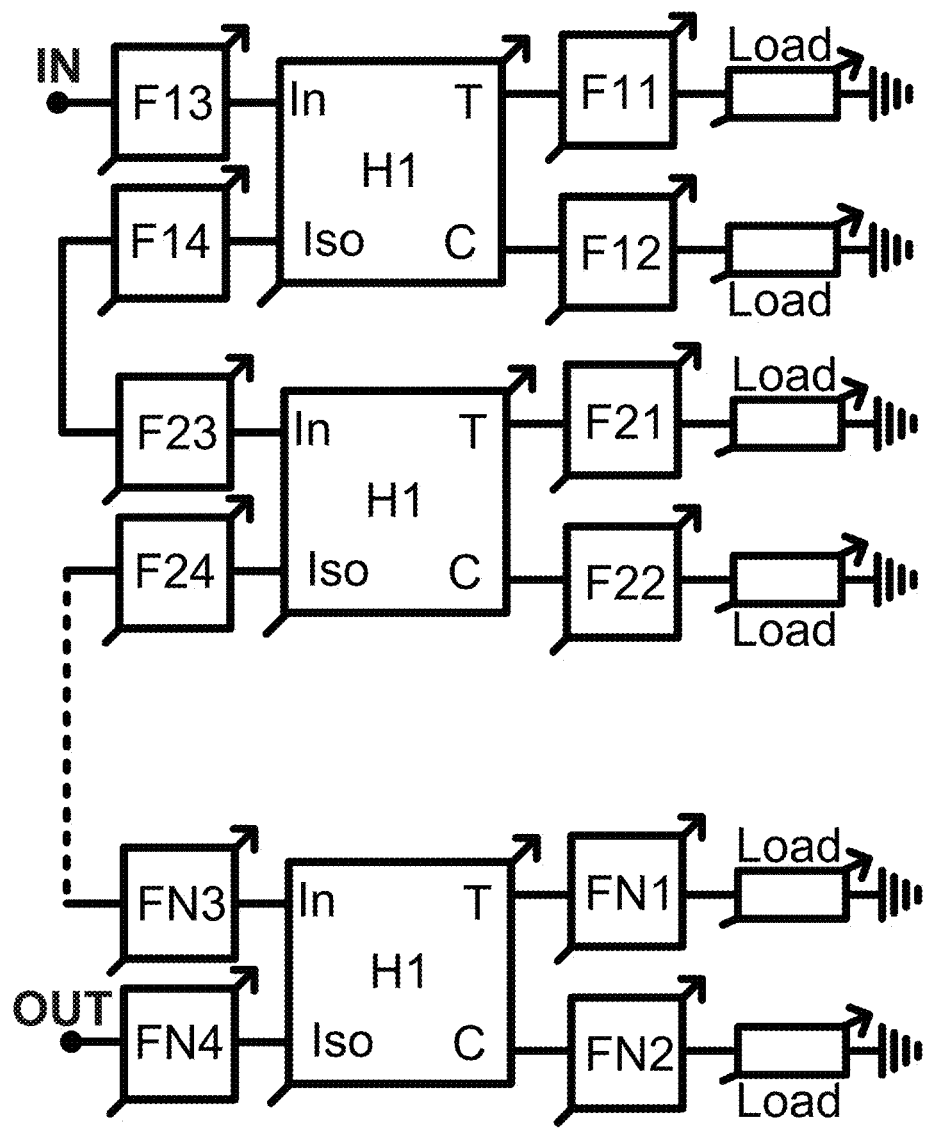

FIG. 8 illustrates an embodiment of a two-port filter realized as a nested connection of multiple reflection-type filters that are realized using the approach shown in FIG. 6. Fixed as well as tunable/reconfigurable versions of this approach may be used.

Figure 9:
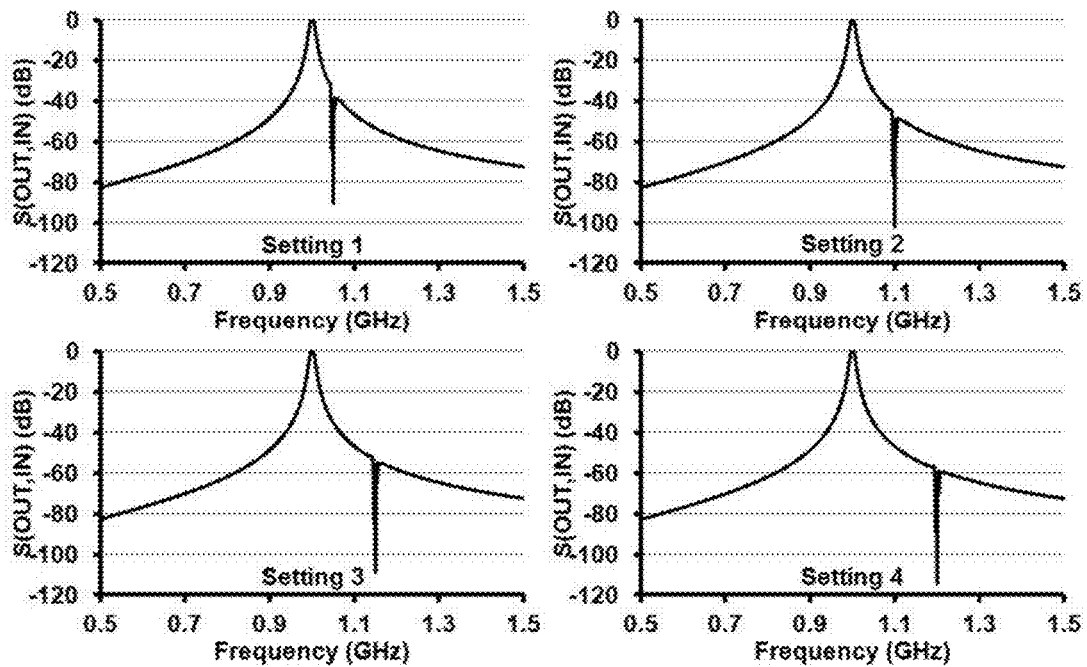

FIG. 9 shows illustrative simulation results for a tunable/reconfigurable filter embodiment realized using the approach of FIG. 4. Different graphs correspond to the filter response at different represented settings.

Figure 10:
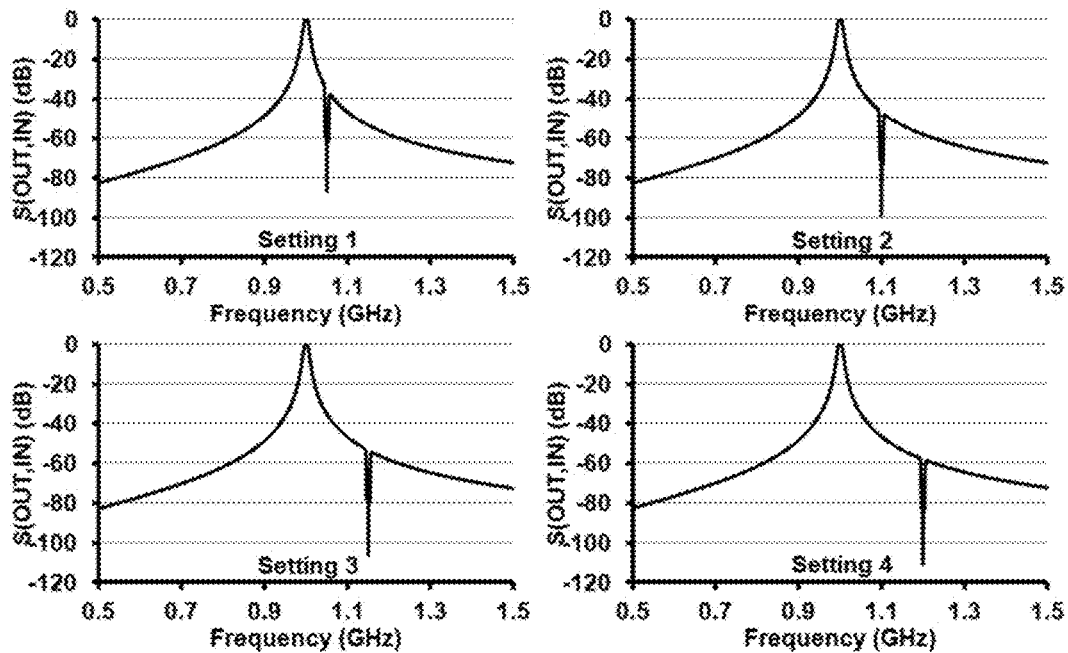

FIG. 10 shows illustrative simulation results for a tunable/reconfigurable filter embodiment realized using the approach of FIG. 6. Different graphs correspond to the filter response at different represented settings.

FIG. 11 shows illustrative simulation results for a tunable/reconfigurable filter embodiment realized using the approach of FIG. 7. Different graphs correspond to the filter response at different represented settings.

FIG. 12 shows illustrative simulation results for a tunable/reconfigurable filter embodiment realized using the approach of FIG. 8. Different graphs correspond to the filter response at different represented settings.

Figure 13:
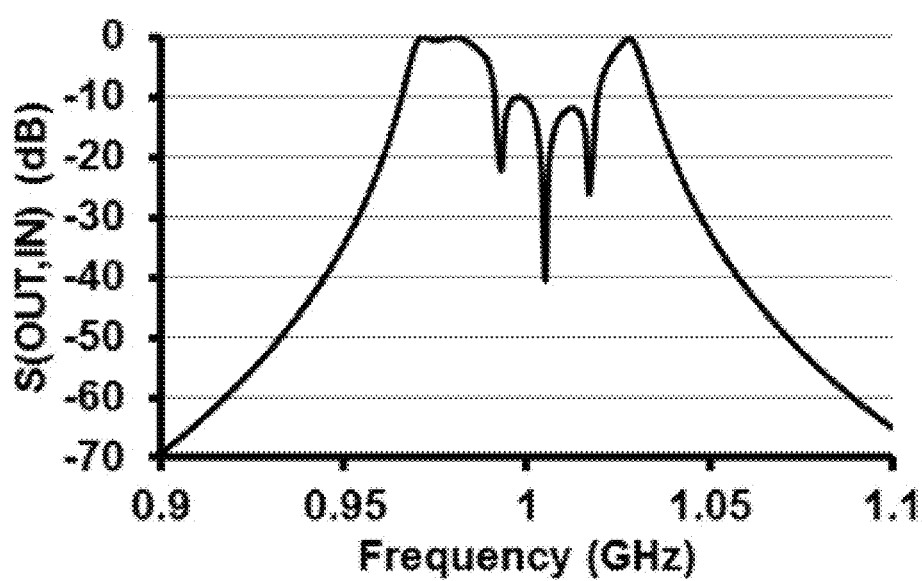

FIG. 13 shows another illustrative simulation result for a tunable/reconfigurable filter embodiment realized using the approach of FIG. 4 for meeting concurrent multi-band scenarios.

DESCRIPTION OF ILLUSTRATIVE EMBODIMENTS

Illustrative embodiments are now described. Other embodiments may be used in addition or instead. Details that may be apparent to a person of ordinary skill in the art may have been omitted. Some embodiments may be practiced with additional components or steps and/or without all of the components or steps that are described.

Throughout this disclosure, the term signal is used to designate a quantity that has values over time. The specific structure of the signal is not material unless explicitly stated. A signal need not be generated from a single source. For instance, collection of signals received from multiple transmitting sources by a single antenna is still referred to as a signal.

Throughout this disclosure, the term filter corresponds to a two-port network with a corresponding transfer function in frequency domain. The transfer function of the two-port network need not resemble the classical transfer function of known filters such as band pass filters (BPF), low pass filters (LPF), high pass filters (HPF), and band stop filters (BSP) also known as band reject filters (BRF). For instance, the transfer function of the two-port network may have multiple passbands or multiple stopbands or a combination of pass bands and stop bands. Specifically, the usage of passband or stopband should not be interpreted as a single contiguous frequency band. Passband is referred to the range of all frequencies where the signal passes through the two-port network with little or no attenuation, and stopband is referred to the range of all frequencies where the signal does not pass through the two-port network or it passes through the two-port network with significant attenuation. Passband or stopband may include multiple disjoint frequency bands. The two-port network may use active or passive components in its realization.

Throughout this disclosure, the term transfer function indicates a mathematical representation between variables that appear across terminals of a component, network, or circuit. The transfer function may indicate the relationship between various ports of a multi-port network. The transfer function may use voltages, currents, powers, charges, fluxes, etc. as its variable. The transfer function may or may not have units.

Throughout this disclosure, the terms tunable and reconfigurable refer to cases where circuitry is modified in response to at least one stimulus. The stimuli may be electrical such as voltage or current, mechanical, or of any other nature. Modification in a tunable or reconfigurable circuitry may lead to modification in a corresponding transfer function leading to a tunable or reconfigurable transfer function. Tunable transfer function generally refers to changing the specifications without substantially changing the structure (or shape) of the transfer function. For instance, the location and bandwidths of passbands or stopbands can be modified in a tunable filter. A reconfigurable transfer function generally refers to changing the structure (or shape) of the transfer function. For instance, a band-pass response may be modified to become a band-stop response in a reconfigurable filter. For the purpose of this disclosure, circuit modifications through mechanical addition or subtraction of components or rerouting of connections does not fall within reconfigurability or tunability. For instance, soldering or de-soldering components may lead to a new filter transfer function; but, this approach does not fall within a tunable or reconfigurable filter in this disclosure. Tunable or reconfigurable circuits may incorporate switches, diodes, or transistors to enable tunability or reconfigurability. The underlying mechanism for tuning can be electrical, optical, electromagnetic, mechanical, acoustic, chemical, or any of their combinations.

Figure 1:
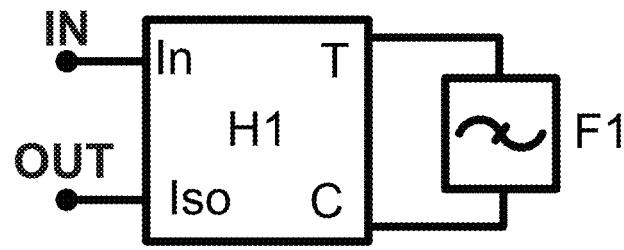
FIG. 1 illustrates an embodiment of a prior art two-port reflection-type filter realized by placing filter F1 between through (T) and coupled (C) ports of a hybrid coupler H1.

FIG. 1 illustrates an embodiment of a prior art two-port reflection type filter approach (WO 95/15018, U.S. Pat. No. 5,525,945, U.S. Pat. No. 8,749,321) where a two-port network F1 is connected between a through (T) port and a coupler (C) port of a hybrid coupler (H1). If the hybrid coupler is an ideal quadrature hybrid coupler, that is transfer functions from an input port (IN) to the T and C ports have 90° phase shift difference (or in other words T and C are in quadrature) and the hybrid is lossless, the transfer function from IN to an isolation port (ISO) of the hybrid coupler H1 may be written as:

$$S_{ISO,IN} = j*(1/2)*(S_{11,F1}+S_{22,F1})+(1/2)*(S_{21,F1}-S_{12,F1}),$$

where $S_{x,y}$ denotes the scattering matrix parameter between ports x and y, and "j" is the complex symbol equal to $\sqrt{-1}$ having unity magnitude and 90° phase shift. For instance, $S_{21,F1}$ corresponds to the $S_{21}$ of the two-port network F1 which may be a filter. If $S_{21,F1}$ and $S_{12,F1}$ of the two port network F1 are identical, for instance in a passive reciprocal two-port network, the transfer function between from IN to ISO may become:

$$S_{ISO,IN} = j*(1/2)*(S_{11,F1}+S_{22,F1}).$$

In other words, in this case, the forward transfer function from the input to the isolation port of the hybrid may depend on the reflection coefficients of the two port network F1, namely $S_{11,F1}$ and $S_{22,F1}$.

For example, if the input and output reflection coefficients of the two-port network F1 follow a band-stop response at the same frequency range, the transfer function from IN to ISO may also follow a band-stop response at the same frequency range. For instance, a two-port network can be designed to have band-pass transfer functions between the two ports and band-stop reflection coefficients at both ports. If this two-port network is used as F1, the transfer function from IN to ISO may follow a band-stop response. In this case, the reflection-type approach may invert the transfer function of the two-port network F1.

Figure 2:
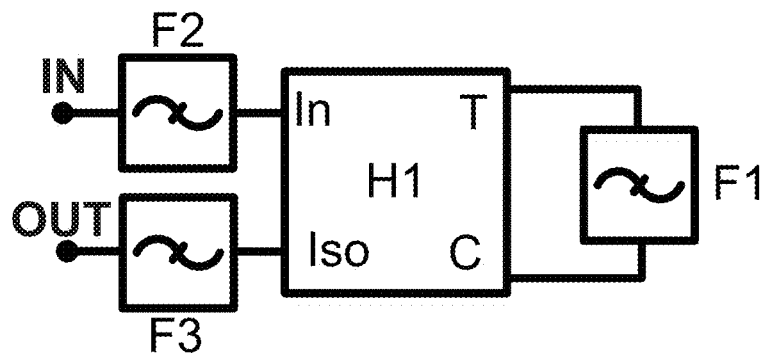
FIG. 2 illustrates an embodiment a prior art two-port reflection-type filter realized by placing filter F1 between through (T) and coupled (C) ports of a hybrid coupler H1, and two other filters F2 and F3 connected in series with the input (In) and isolated (Iso) ports of the hybrid coupler and the two-port reflection-type filter ports.

Other two-port networks may be added in series with the IN or the ISO ports of the aforementioned approach. FIG. 2 shows such an approach where two-port networks F2 and F3 are added in series with an IN port and an ISO port of a hybrid coupler H1. A combination of the transfer function of the two port networks F2 and F3, and the transfer function offered by a combination of hybrid coupler H1 and two-port network F1 (as described above) may determine the overall transfer function in the new two-port network.

The two-port networks F1, F2, and F3 may be designed to achieve a desired transfer function. For instance, F2 and F3 may have band-pass transfer functions and the two-port network F1 may have band-stop reflection coefficient at a different frequency band. In this case, the overall transfer function may be band-pass with additional stop-band (or notch) for further attenuation of certain frequencies. One advantage of this approach may be that attenuation at the undesired frequencies does not require extremely high-order filters or components that have very high quality factor. It is possible that only one of the two-port networks F2 or F3 is used in this approach, in addition to the hybrid coupler H1 and two-port network F1.

Figure 3:
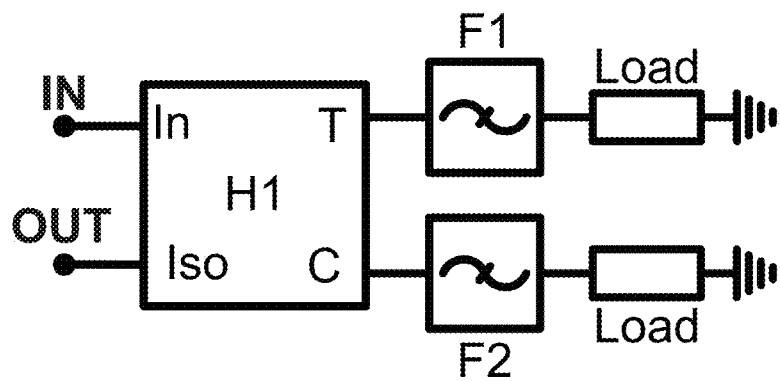
FIG. 3 illustrates an embodiment of a prior art two-port reflection-type filter realized by terminating the through (T) and coupled (C) ports of a hybrid coupler H1 with two filters F1 and F2 and their associated loads.

FIG. 3 illustrates another embodiment of a prior art two-port reflection type filter (U.S. Pat. No. 4,694,266, U.S. Pat. No. 4,963,945, U.S. Pat. No. 8,013,690). The operation principle of this approach may be similar to that of FIG. 1. However, this may use two two-port networks F1 and F2 and two associated loads that are connected to the coupled ports of a hybrid coupler H1. One advantage of FIG. 3 versus FIG. 1 may be added flexibility. Specifically, if the hybrid coupler H1 is an ideal quadrature hybrid coupler, that is the transfer functions from an input port (IN) to T and C ports have 90° phase shift difference (T and C are in perfect quadrature) and the hybrid coupler H1 is lossless, the transfer function from IN to ISO may be written as:

$$S_{ISO,IN} = j*(1/2)*(S_{11,F1}+S_{11,F2}).$$

The two-port networks F1 and F2 can be designed so that the addition of their input reflection coefficients, namely $S_{11,F1}$ and $S_{11,F2}$, results in a desired response.

Prior art illustrations and realizations of reflection-type filters cover approaches with predetermined transfer functions using fixed structures for the hybrid coupler, two-port networks, and their associated loads. Furthermore, prior art may focus on fixed transfer functions with a single passband or band-stop responses.

With the current and future dominance of multi-standard multi-band radios and wireless platforms with operability at multiple bands, a predetermined frequency response of the filter may be very restrictive. For example, state-of-the-art cellular phones may require operation over more than thirty frequency bands. One solution is to use a bank of multiple filters with predetermined frequency responses and a switching network to switch between the filters depending on the desired frequency band of operation. This approach may require a large footprint and may suffer from loss of the switching network.

FIG. 4 illustrates an embodiment of a tunable/reconfigurable two-port reflection-type filter of the type illustrated in FIG. 2 that allows for a tunable/reconfigurable frequency response. In this approach, a hybrid coupler H1 and/or one or more of two-port filters F1, F2, and F3 may be tunable/reconfigurable. This may lead to a tunable/reconfigurable overall two-port network. Variations of this approach may include cases where F2 and/or F3 may not be present.

FIG. 5 illustrates an embodiment of a tunable/reconfigurable two-port reflection-type filter of the type illustrated in FIG. 3 that allows for a tunable/reconfigurable frequency response. In this approach, a hybrid coupler H1 and/or one or more of two-port filters F1 and F2 and/or their associated loads may be tunable/reconfigurable. This may lead to a tunable/reconfigurable overall two-port network.

FIG. 6 illustrates an embodiment of a tunable/reconfigurable reflection-type filter realized by terminating a through (T) port and a coupled (C) port of a tunable/reconfigurable hybrid coupler H1 with two tunable/reconfigurable filters F1 and F2 and their associated tunable/reconfigurable loads/ Two other tunable/reconfigurable filters may be placed in series with an input (In) and isolated (Iso) ports of the tunable/reconfigurable hybrid coupler and the tunable/reconfigurable two-port reflection-type filter ports. A tunable/reconfigurable response may be realized when the hybrid coupler H1 and/or one or more of the filters F3, F4, F1, F2, or their associated loads is tunable/reconfigurable. For instance, the two-port networks F1, F2, F3, and F4 may be designed in such a way that the overall transfer function has one or more passbands at certain frequencies and one or more stopbands at other certain frequencies. Transfer functions or reflection coefficients of the filters F1, F2, F3, and F4 may be tunable/reconfigurable so that the overall transfer function of the new two-port network is also tunable/reconfigurable. Other embodiments of this approach may not include filters F3 or F4.

FIG. 7 illustrates an embodiment of a two-port filter realized as a nested connection of multiple reflection-type filters that are realized of the type shown in FIG. 4. The filter may include hybrid couplers H1 through HN and two-port networks F11, F12, and F13 through FN1, FN2, and FN3. The order of this nested reflection-type filter can be increased by adding more units in series. Fixed, as well as tunable/reconfigurable versions, of this approach may be used. Some or all of the components in series with the In or Iso ports of the hybrid couplers may instead not be present.

The two-port networks in series, such as filters F13 and F22, may be combined into one to ease implementation.

FIG. 8 illustrates an embodiment of a two-port filter realized as a nested connection of multiple reflection-type filters that are realized using the approach shown in FIG. 6. The order of this nested reflection-type filter can be increased by adding more units in series. Fixed as well as tunable/reconfigurable versions of this approach may be used. Some or all of the components in series with the In or Iso ports of the hybrid couplers may not be present. The two-port networks in series, such as F14 and F23, may be combined into one to ease implementation.

In all of these embodiments, transfer functions of the two-port networks, such as F1, F2, F3, F4, etc., may not resemble the classical transfer function of known filters, such as band pass filters (BPF), low pass filters (LPF), high pass filters (HPF), and band stop filters (BSP), also known as band reject filters (BRF). For instance, the transfer function of a two-port network may have multiple passbands or multiple stopbands or a combination of pass bands and stop bands. A passband or stopband filter also does not necessarily mean a single contiguous frequency band. Passband refers to a range of all frequencies where the signal passes through the two-port network with little or no attenuation. Stopband refers to a range of all frequencies where the signal does not pass through the two-port network or it passes through the two-port network with significant attenuation. Passband or stopband may include multiple disjoint frequency bands.

The transfer function of the two-port networks need not be predetermined or fixed. For instance, the transfer function of the two-port network may be tunable. As one representative example, the transfer function of the two-port network may resemble that of a band-pass filter where center frequency and bandwidth can be tuned. The tunability may be in response to external or internal stimuli. Tunable transfer functions may be realized by incorporating one or more tunable components within the two-port network. For instance, tunable capacitors, tunable inductors, tunable resonators, or their combinations may be used to realize a tunable two-port network.

The circuit configuration of the two-port network need not be predetermined or fixed. For instance, the circuit configuration of the two-port network may be reconfigurable. As one representative example, the two-port network circuitry may resemble that of a band-pass filter where the filter order can be reconfigured. As another representative example, the two-port network circuitry may be reconfigured to change from a band-pass to a band-stop, or vice versa. The reconfigurability may be in response to external or internal stimuli. Reconfigurable circuits may be realized by incorporating one or more switches or other selection circuitry. For instance, mechanical switches or relays, electrical switches using diodes or transistors, Micro Electro Mechanical (MEM) switches, or their combination may be used within the reconfigurable two-port network. A reconfigurable two-port network may also have a tunable transfer function. A two-port network with a tunable transfer function may also incorporate reconfigurable circuitry. However, "reconfigurable" would not include replacing one or more component by unsoldering them.

The filter may be realized using passive components, active components, or a combination of active and passive components. The two-port network may use electrical, electro-mechanical, piezo-electric, or other types of components in its realization. For instance, the two-port network realization may include inductors, capacitors, resonators, transmission lines, or a combination. For instance, the two-port network realization may include Surface Acoustic Wave (SAW) or Bulk Acoustic Wave (BAW) components. Other variations may also be made.

FIG. 9 shows illustrative simulations for the embodiment described in FIG. 4. Here, F2 is a fixed BPF filter at 1 GHz, F3 is an all-pass filter (or no F3 at all), and F1 is a BPF with tunable center frequency. In these illustrative simulations, the center frequency of F1 is tuned from 1.05 GHz to 1.2 GHz in steps of 0.05 GHz and is indicated in the graphs as a "setting." The combination of hybrid coupler H1 and tunable BPF F1 results in a tunable BSF. This example may be used in wireless communication schemes where the location of the undesired blockers, interferers, or jammers can vary.

FIG. 10 shows illustrative simulations for the embodiment described in FIG. 6. Here, F3 is fixed BPF filter at 1 GHz, F4 is an all-pass filter (or no F4 at all), and F1 and F2 are identical BPFs with tunable center frequency. In these illustrative simulations, the center frequencies of F1 and F2 are tuned from 1.05 GHz to 1.2 GHz in steps of 0.05 GHz and is indicated in the graphs as a "setting." The combination of hybrid coupler H1 and tunable BPFs F1 and F2 results in a tunable BSF. This example may be used in wireless communication schemes where the location of the undesired blockers, interferers, or jammers can vary.

FIG. 11 shows illustrative simulations for the embodiment described in FIG. 7 for N=3. Here, F12 is fixed BPF centered at 1 GHz, F13, F22, F23, F32, F33 are all-pass filters (or no filters at all), and F11, F21, and F31 are BPFs with independently controlled tunable center frequencies. In these illustrative simulations, for setting 1, the center frequencies of F11, F21, and F31 are tuned to 1.1 GHz, 1.15 GHz, and 1.3 GHz, respectively, resulting in three stopbands (or notches) at those frequencies in the overall transfer function. For setting 2, the center frequencies of F11, F21, and F31 are tuned to 1.1 GHz, 1.25 GHz, and 1.3 GHz, respectively, resulting in three stopbands (or notches) at those frequencies in the overall transfer function. This example may be used in wireless communication schemes where the number and locations of the undesired blockers, interferers, or jammers can vary.

FIG. 12 shows illustrative simulations for the embodiment described in FIG. 8 for N=3. Here, F13 is fixed BPF filter at 1 GHz, F14, F23, F24, F33, and F34 are all-pass filters (or no filters), and F11, F12, F21, F22, F32 and F32 are BPFs with independently controlled tunable center frequencies. In these illustrative simulations, for setting 1, the center frequencies of F11 and F12 are tuned at 1.1 GHz, center frequencies of F21 and F22 are tuned to 1.15 GHz, and center frequencies of F31 and F31 are tuned to 1.3 GHz. For setting 2, the center frequencies of F11 and F12 are tuned to 1.1 GHz, center frequencies of F21 and F22 are tuned to 1.25 GHz, and center frequencies of F31 and F32 are tuned to 1.3 GHz. This example may be used in wireless communication schemes where the number and locations of the undesired blockers, interferers, or jammers can vary.

FIG. 13 shows another illustrative simulation for the embodiment described in FIG. 4 for meeting requirements of multiple communication systems that operate concurrently and in close physical proximity of each other. In this example, two concurrent passbands located in close proximity to one another are generated by using a wideband bandpass filter for F2, while the center frequency of the bandpass filter F1 is chosen to lie in between the passband of F2. F1 and/or F2 can be reconfigurable and/or tunable.

Various components of this invention may be realized as integrated circuits. The entire scheme or some of its components may be realized monolithically on the same substrate. The entire scheme or some of its components may be integrated alongside other circuits. For instance, parts of or the entire scheme may be integrated with parts or the entire a communication receiver, transmitter, or transceiver in a monolithic integrated circuit, or on the same package, or in the same platform.

The components, steps, features, objects, benefits, and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, objects, benefits, and/or advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

All articles, patents, patent applications, and other publications that have been cited in this disclosure are incorporated herein by reference.

The phrase "means for" when used in a claim is intended to and should be interpreted to embrace the corresponding structures and materials that have been described and their equivalents. Similarly, the phrase "step for" when used in a claim is intended to and should be interpreted to embrace the corresponding acts that have been described and their equivalents. The absence of these phrases from a claim means that the claim is not intended to and should not be interpreted to be limited to these corresponding structures, materials, or acts, or to their equivalents.

The scope of protection is limited solely by the claims that now follow. That scope is intended and should be interpreted to be as broad as is consistent with the ordinary meaning of the language that is used in the claims when interpreted in light of this specification and the prosecution history that follows, except where specific meanings have been set forth, and to encompass all structural and functional equivalents.

Relational terms such as "first" and "second" and the like may be used solely to distinguish one entity or action from another, without necessarily requiring or implying any actual relationship or order between them. The terms "comprises," "comprising," and any other variation thereof when used in connection with a list of elements in the specification or claims are intended to indicate that the list is not exclusive and that other elements may be included. Similarly, an element preceded by an "a" or an "an" does not, without further constraints, preclude the existence of additional elements of the identical type.

None of the claims are intended to embrace subject matter that fails to satisfy the requirement of Sections 101, 102, or 103 of the Patent Act, nor should they be interpreted in such a way. Any unintended coverage of such subject matter is hereby disclaimed. Except as just stated in this paragraph, nothing that has been stated or illustrated is intended or should be interpreted to cause a dedication of any component, step, feature, object, benefit, advantage, or equivalent to the public, regardless of whether it is or is not recited in the claims.

The abstract is provided to help the reader quickly ascertain the nature of the technical disclosure. It is submitted with the understanding that it will not be used to interpret or limit the scope or meaning of the claims. In addition, various features in the foregoing detailed description are grouped together in various embodiments to streamline the disclosure. This method of disclosure should not be interpreted as requiring claimed embodiments to require more features than are expressly recited in each claim. Rather, as the following claims reflect, inventive subject matter lies in less than all features of a single disclosed embodiment. Thus, the following claims are hereby incorporated into the detailed description, with each claim standing on its own as separately claimed subject matter.

The invention claimed is:

1. A two-port tunable or reconfigurable network having a filter transfer function comprising:
   a network input port;
   a network output port;
   a hybrid coupler having a hybrid input port, a hybrid isolated port, a hybrid through port, and a hybrid coupled port;
   a first internal two-port network connected between the network input port and the hybrid input port;
   a second internal two-port network connected between the network output port and the hybrid isolated port; and
   a third internal two-port network connected between the hybrid through port and the hybrid coupled port,
   wherein at least one of the first internal two-port network, the second internal two-port network, the third internal two-port network, and the hybrid coupler are tunable or reconfigurable in response to an electrical signal or a user-operated control in a way that tunes or reconfigures the filter transfer function of the two-port tunable or reconfigurable network.

2. The two-port tunable or reconfigurable network of claim 1 wherein the filter transfer function has multiple passbands or stopbands.

3. The two-port tunable or reconfigurable network of claim 1 wherein at least one of the first internal two-port network, the second internal two-port network, the third internal two-port network, and the hybrid coupler is an integrated circuit.

4. The two-port tunable or reconfigurable network of claim 1 wherein at least one of the first internal two-port network, the second internal two-port network, the third internal two-port network, and the hybrid coupler are on the same substrate.

5. The two-port tunable or reconfigurable network of claim 1 wherein at least one of the first internal two-port network, the second internal two-port network, the third internal two-port network, and the hybrid coupler are integrated with a receiver, a transmitter, or a transceiver.

6. A two-port tunable or reconfigurable network comprising multiple instances of the two-port tunable or reconfigurable network of claim 1 connected in series.

7. A two-port tunable or reconfigurable network having a filter transfer function comprising:
   a network input port;
   a network output port;
   a hybrid coupler having a hybrid input port, a hybrid isolated port, a hybrid through port, and a hybrid coupled port;
   a first load;
   a second load;
   a first internal two-port network connected between the first load and the hybrid through port;

a second internal two-port network connected between the second load and the hybrid coupled port;
a third internal two-port network connected between the network input port and the hybrid input port; and
a fourth internal two-port network connected between the network output port and the hybrid isolated port,
wherein at least one of the first internal two-port network, the second internal two-port network, the third internal two-port network, the fourth internal two-port network, the hybrid coupler, the first load, and the second load are tunable or reconfigurable in response to an electrical signal or a user-operated control in a way that tunes or reconfigures the filter transfer function of the two-port tunable or reconfigurable network.

8. The two-port tunable or reconfigurable network of claim 7 wherein the filter transfer function has multiple passbands or stopbands.

9. The two-port tunable or reconfigurable network of claim 7 wherein at least one of the first internal two-port network, the second internal two-port network, the third internal two-port network, the fourth internal two-port network, the hybrid coupler, the first load and the second load is an integrated circuit.

10. The two-port tunable or reconfigurable network of claim 7 wherein at least one of the first internal two-port network, the second internal two-port network, the third internal two-port network, the fourth internal two-port network, the hybrid coupler, the first load, and the second load are on the same substrate.

11. The two-port tunable or reconfigurable network of claim 7 wherein at least one of the first internal two-port network, the second internal two-port network, the third internal two-port network, the fourth internal two-port network, the hybrid coupler, the first load, and the second load are integrated with a receiver, a transmitter, or a transceiver.

12. A two-port tunable or reconfigurable network comprising multiple instances of the two-port tunable or reconfigurable network of claim 7 connected in series.

* * * * *